(12) United States Patent
Raravikar et al.

(10) Patent No.: US 8,558,218 B2
(45) Date of Patent: Oct. 15, 2013

(54) METHODS OF FORMING CARBON NANOTUBES ARCHITECTURES AND COMPOSITES WITH HIGH ELECTRICAL AND THERMAL CONDUCTIVITES AND STRUCTURES FORMED THEREBY

(75) Inventors: Nachiket Raravikar, Gilbert, AZ (US); Daewoong Suh, Phoenix, AZ (US); Chris Matayabas, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/371,749

(22) Filed: Feb. 13, 2012

(65) Prior Publication Data
US 2012/0148842 A1 Jun. 14, 2012

Related U.S. Application Data

(62) Division of application No. 11/689,288, filed on Mar. 21, 2007, now Pat. No. 8,158,968.

(51) Int. Cl.
*H01L 31/00* (2006.01)
(52) U.S. Cl.
USPC .............. 257/26; 257/E29.047; 257/E29.245
(58) Field of Classification Search
USPC ..................... 257/1, 26, E29.07, E29.245
See application file for complete search history.

(56) References Cited

U.S. PATENT DOCUMENTS

| 6,340,822 | B1 | 1/2002 | Brown et al. |
| 2002/0113335 | A1 | 8/2002 | Lobovsky et al. |
| 2004/0241900 | A1 | 12/2004 | Tsukamoto et al. |
| 2007/0228926 | A1 | 10/2007 | Teo et al. |
| 2007/0248794 | A1* | 10/2007 | Gstrein et al. ................ 428/137 |

FOREIGN PATENT DOCUMENTS

CN 1558932 A 12/2004

OTHER PUBLICATIONS

Office action received for Chinese Patent Application No. 2008100966859, mailed on Jul. 27, 2010, 7 pages.
Kong, F.Z. et al., "Continuous Ni-Layer on Multiwall Carbon Nanotubes by an Electroless Plating Method," Surface and Coatings Technology, published in Jun. 2002, vol. 155, pp. 33-36.
Office action received for Korean Patent Application No. 10-2008-26377, mailed on Feb. 3, 2010, pp. 1-6.
Zhang et al. "Monochiral tubular graphites cones formed by radial layer-by-layer growth," Physical Review B 71, 113411, 2005.
Office action received for Chinese Patent Application No. 200810096685.9, mailed on Oct. 18, 2011, 6 pages of Chinese office action and 10 pages of English translation.

* cited by examiner

*Primary Examiner* — Matthew Reames
(74) *Attorney, Agent, or Firm* — Blakely, Sokoloff, Taylor & Zafman LLP

(57) ABSTRACT

Methods and associated structures of forming microelectronic devices are described. Those methods may include method of forming a layered nanotube structure comprising a wetting layer disposed on a nanotube, a Shottky layer disposed on the wetting layer, a barrier layer disposed on the Shottky layer, and a matrix layer disposed on the barrier layer.

6 Claims, 5 Drawing Sheets

METHODS OF FORMING CARBON NANOTUBES ARCHITECTURES AND COMPOSITES WITH HIGH ELECTRICAL AND THERMAL CONDUCTIVITES AND STRUCTURES FORMED THEREBY

CROSS REFERENCE TO RELATED APPLICATIONS

The present application is a divisional of now pending U.S. patent application Ser. No. 11/689,288, entitled "METHODS OF FORMING CARBON NANOTUBES ARCHITECTURES AND COMPOSITES WITH HIGH ELECTRICAL AND THERMAL CONDUCTIVITES AND STRUCTURES FORMED THEREBY" filed on Mar. 21, 2007.

BACKGROUND OF THE INVENTION

Carbon nanotubes (CNT's) in bulk may comprise high current carrying capacity ($\sim 10^9$ A/cm$^2$) and high thermal conductivity (>3000 W/m–K). Thus, carbon nanotubes are promising materials for use in high current density package interconnects, and package thermal materials, for example. However, the properties of individual nanotubes may be difficult to realized in bulk, due to extremely high thermal and electrical resistances that may be present at interfacial regions.

Nanotube-nanotube or nanotube-metal interface is typically non-ohmic in nature. Electrical conduction across such an interface occurs by quantum mechanical tunneling. Depending upon the nature of the nanotube and/or that of the metal, there is also a Schottky barrier formed at the junction, thereby further increasing the resistance at the interface. Also, phonon scattering may occur at nanotube tips. Thus, the overall thermal and electrical resistance of a given nanotube network or nanotube-based composite may depend strongly upon the interfacial properties.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
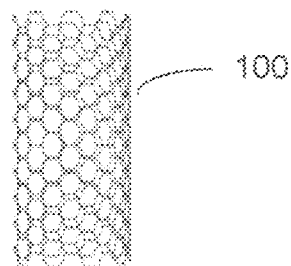
FIGS. 1*a*-1*f* represent structures according to an embodiment of the present invention.
Figure 1B:
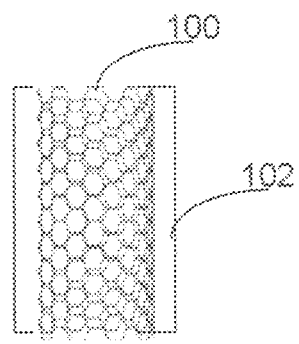

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may include method of forming a layered nanotube structure comprising a wetting layer disposed on a nanotube, a Shottky layer disposed on the wetting layer, a barrier layer disposed on the Shottky layer, and a matrix layer disposed on the barrier layer. Methods of the present invention may reduce electrical and thermal interfacial resistances in both individual and bulk nanotubes, and related devices.

FIGS. 1*a*-1*f* illustrate an embodiment of a method of lowering electrical resistance across nanotube interfaces using functional gradation of materials. FIG. 1*a* illustrates a portion of a nanotube 100. The nanotube 100 may comprise a carbon nanotube in some embodiments, and may also comprise semiconductor and metallic, carbon and non-carbon nanotubes in some embodiments.

Nanotube 100 interfacial resistance (i.e. resistance that may exist between the nanotube 100 and another material) may involve two types of barriers to resistance: a tunneling barrier and a Schottky barrier. The tunneling barrier may comprise a function of quantum mechanical tunneling of electrons through a gap (which may comprise a few angstroms, in some cases) that may exist between the particular nanotube 100 and the neighboring material. In some cases, the gap may exist between another nanotube and/or a metal material, for example. In one embodiment, the tunneling barrier can be reduced by reducing the gap, such as by utilizing materials that wet the nanotube 100 surface.

In one embodiment, a wetting layer 102 may be formed on the nanotube 100 (FIG. 1*b*) in order to reduce the tunneling barrier between the nanotube 100 and a neighboring material. In one embodiment, the wetting layer 102 may comprise at least one of amorphous carbon, graphitic carbon, activated carbon, palladium, nickel, tungsten, titanium, tantalum, platinum, and combinations thereof. Some of the above metals such as titanium, tungsten, and tantalum may serve as effective gold and palladium diffusion barriers, for example, even at elevated temperatures (for example, from about 200 Celsius degrees to about 300 C).

In one embodiment, the wetting layer 102 may reduce a tunneling barrier between the nanotube 100 and a matrix layer, to be described further herein. Alternatively, the electron scattering at a nanotube contact can be increased, by activating the nanotube tips and surface by plasma or acid treatment, for example. By improving electron scattering at the nanotube 100 tips or at surface sites, there will be a finite probability of finding electrons in the tunneling gap, thus reducing the tunneling barrier. Activation of nanotube tips and/or surface by acid or plasma treatments may also help improve wettability with the above-mentioned elements of layer 102. Thus, it will help reducing the tunneling barrier in more than one ways.

Figure 1C:
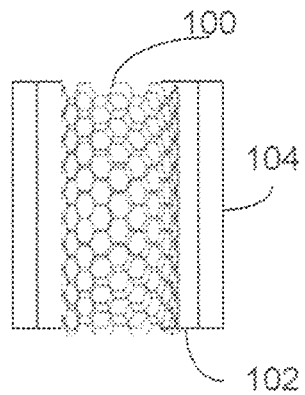
Figure 1D:
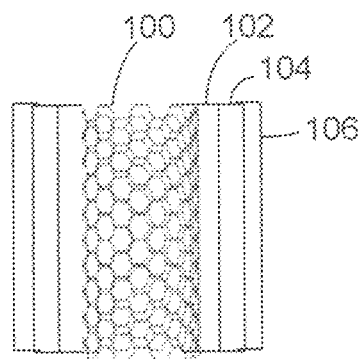
Figure 1E:
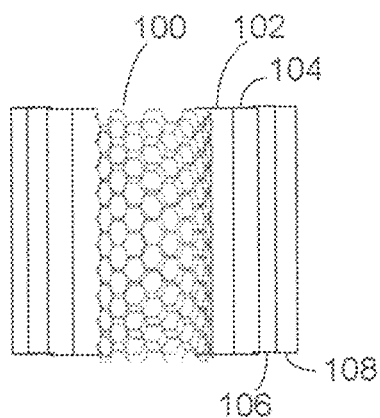
Figure 1F:
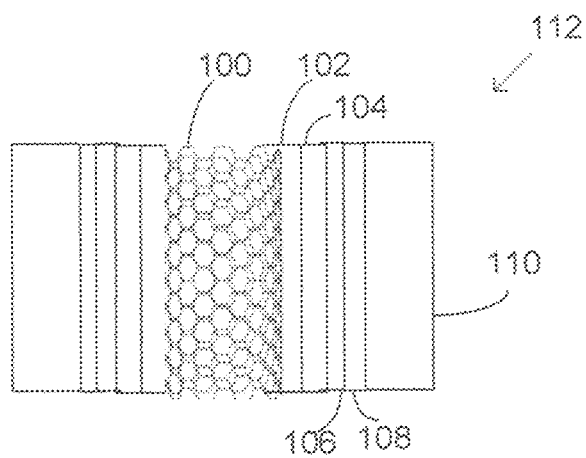

In one embodiment, a Shottky layer 104 may be formed on the wetting layer 102 (FIG. 1*c*). In one embodiment, the Shottky layer 104 may reduce a Shottkey barrier height between the nanotube and the matrix layer or at the carbon coating surface (the latter has about the same work function as that of the nanotube, about 4.7 eV. The Schottky barrier height can be reduced by using a metal with a high enough work function, as given by the following empirical relation: ($\Phi_{BP}$ is the Schottky barrier height), $\Phi_{BP}=(\Phi_{CNT}+E_g/2)-\Phi_M$, wherein $\Phi_{CNT}$ comprises the work function of a nanotube (about 4.7 ev), $E_g$ comprises the nanotube band-gap (which in the case of semi-conducting nanotubes, comprises about 1.1 eV/d(nm), wherein d is the diameter of a nanotube; $\Phi_M$ comprises a metal work function (—which may comprise about 5 eV for palladium and rhodium, for example).

In one embodiment, a semi-conducting nanotube comprising a diameter of about 1.4 nm, the metal work function needs to be about 5.47 eV to achieve a zero Schottky barrier height. In the case of a metal nanotube, wherein a band gap ($E_g$) is about zero, the metal work function needs to be about 4.7 eV to achieve a zero Schottky barrier height. In some embodiments, rhodium and nickel may form some of the lowest Schottky barrier contacts in combination with semi-conducting nanotubes, whereas tungsten, titanium, silver, mercury and carbon would form some of the lowest Shottky barrier contacts when combined with metallic nanotubes. Some other metals such as palladium, cobalt, selenium, beryllium, and gold may form relatively low Shottky barrier contacts with both semiconducting and metallic nanotubes.

In one embodiment, various solders may form medium-to-high Schottky barrier contacts with nanotubes. For example, if a thin layer of a low Schottky barrier metal such as palladium, ruthenium or silver is coated on the nanotube 100 surface prior to mixing with a solder matrix, it would easily dissolve into the solder matrix, simply due to non-zero entropy of mixing. For such small length scales, such a low Schottky barrier metal would likely be completely depleted into the solder matrix. Also, not all of the low Schottky barrier metals, (except palladium), wet nanotubes. Thus, in some cases, there will be a finite tunneling barrier, although the Schottky barrier may be reduced.

Thus, a layered approach is advantageous, wherein electronic properties may be changed gradually from nanotube to solder, for example, with a stable, low contact resistance interface. Hence, a wetting layer 102 that reduces the tunneling barrier by wetting the nanotube 100, followed by a low Schottky layer 104, and then further employing a diffusion barrier layer 106 (FIG. 1d) formed on the Schottkey layer 104, followed by a matrix layer 110 (FIG. 1f), may be employed.

In one embodiment, the barrier layer 106 may comprise at least one of nickel, titanium, tantalum, tungsten and platinum. The barrier layer 106 may serve to assist wetting with the matrix layer 110, which may comprise solder or other neighboring materials such as copper, for example, and may simultaneously prevent diffusion of the Schottky layer 104 into the neighboring materials. In one embodiment, a conductive polymer may be formed on the barrier layer 106, wherein the conductive polymer comprises conjugated polymers and wherein the matrix layer 110 comprises a polymer matrix.

In one embodiment, an optional adhesion layer 108 (FIG. 1e), such as platinum, palladium or nickel may be formed on the barrier layer 106, depending upon the Schottky layer 104 material, barrier layer 106 material and the neighboring matrix material. At least one of the wetting layer 102, Schottky layer, 104, barrier layer 106 and adhesion layer 108 can perform more than one function, for example at least one of the layers can function as both a diffusion barrier as well as adhesion promoter and, in some cases, may even reduce the Schottky barrier, too. Examples of such metals include cobalt, titanium and tungsten. In one embodiment, a single element-layer can function as one or more of the wetting layer 102, the schottky layer 104, the barrier layer 106 and the adhesion layer 108.

The thicknesses of the at least one of the wetting layer 102, the Schottky layer 104, the barrier layer 106 and the adhesion layer 108 (i.e., the combined thickness of the layered nanotube structure 112) may comprise less than about 5 microns in some embodiments. Thinner layers would help lower the overall size of the nanotube 100. However, the thinner layers may get completely dissolved into the matrix solder upon reflow, due to solubility in matrix and the non-zero configurational entropy of mixing. Hence the total thickness of the layers is expected to be of the order of a few microns.

Employing relatively thin barrier layer/adhesion layers may help minimize the total layer thickness, because of their low intrinsic diffusivities. Other combinations of metals and metal-layers are possible, depending upon the type of matrix metal and type of nanotube 100.

Processing of the layered nanotube structure 112 may be performed utilizing techniques known in the art, such as but not limited to, forming carbon materials onto nanotube powders by low temperature chemical vapor deposition (CVD) or simple solvent mixing of nanotubes with carbons followed by solvent removal. Deposition of layers of metals onto the nanotube 100 surface may be include but are not limited to, such processes as atomic layer deposition, sputter deposition, electroplating, electro-less deposition or chemical functionalization through linker molecules such as epoxy amines or carboxylic acids. This may be followed by composite processing, including mixing nanotubes with matrix phase, or infiltration of matrix phase into a pre-designed nanotube network.

Figure 2:
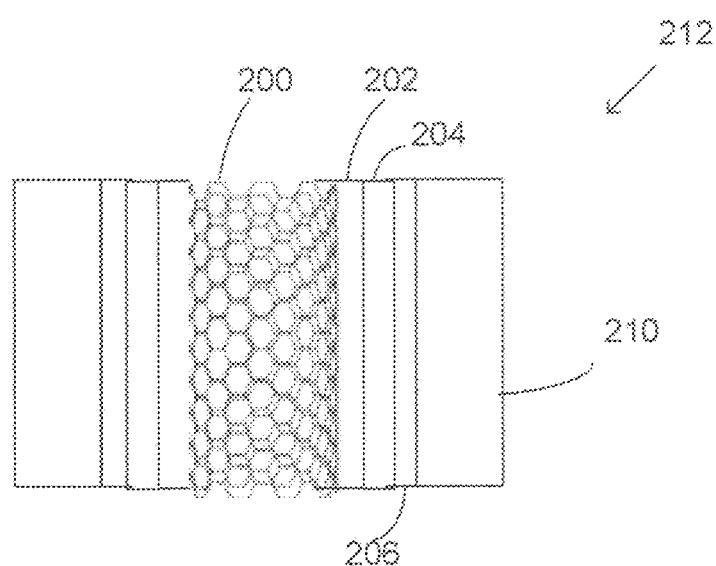
FIG. 2 represent structures according to an embodiment of the present invention.

FIG. 2 depicts a layered nanotube structure 212, which may be formed by using similar processing techniques as those of the layered nanotube structure 112. The layered nanotube structure 212 may lower the thermal resistance of an interface between a nanotube 200 and a matrix layer 210, wherein the matrix layer may comprise materials such as, but not limited to, at least one of at least one of a neighboring nanotube, a solder, a metal and a polymer. The layered nanotube structure 212 may lower the thermal resistance of the interface and/or the nanotube 200 by using gradation of lattice parameters of the various layered materials and/or gradation of bond strengths, which will help minimize phonon scattering. The choice of the specific interface materials may depend upon the matrix layer 210 material.

For example, when the matrix 210 comprises metal containing materials, such as but not limited to, solder and/or copper, the nanotube 200 can first be coated with a carbon containing layer 202, that may comprise carbon black, amorphous carbon an/or activated carbon in some embodiments. The carbon containing layer 202 comprises a close lattice match or carbon to carbon bond lengths or graphitic pi-stacking, with those of the nanotube 200. A carbide forming layer 204 may be formed on the carbon containing layer 202 and may comprise, in some embodiments, metals that may bond well with carbon. Such metals may include tungsten, nickel, titanium, tantalum and combinations thereof.

A matrix reacting layer 206 may then be formed on the carbide forming layer 204, and may comprise such metals as nickel, that bond with a metallic matrix layer 210. The deposition of amorphous carbon can be achieved through utilizing a CVD process, for example, while the various metals may be deposited by ALD, or sputtering, for example, similar to the processes previously described herein.

In the case when the matrix layer 210 comprises a polymer material, the carbon layer 202 can be functionalized with epoxy-amine chains, (instead of the carbide forming layer 204 and the matrix reacting layer 206) that can then bond or entangle with polymer chains the matrix layer 210. In another embodiment, non-covalent functionalization of the carbon layer 202 may be performed by using conjugated polymer systems, such as pyrenes (please add) for example. Conjugated polymer systems may comprise double bonds, aromatic rings with aliphatic chains etc. that may stack on each other but may comprise good atomic registry, (which will assists in thermal and/or electrical transport).

Figure 3A:
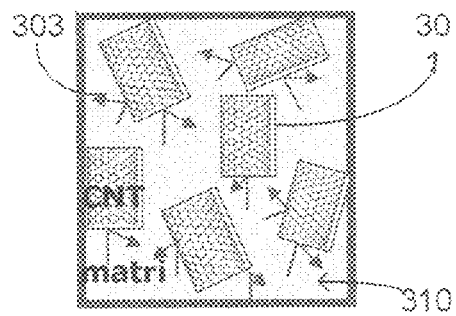
FIG. 3*a* represents structures according to the Prior Art.

FIG. 3a depicts prior art nanotubes 301, in which phonons 303 and/or electrons are scattered at interfaces of between the nanotubes 301 and the matrix 310, which leads to nanotube 301 thermal interfacial resistance and/or nanotube 301 electrical interfacial resistance. The electrical resistance of a nanotube with ideal contacts is about 6.5 kΩ, which is half the quantum resistance of a single transmitting channel, or an electron [$\sim 1/(2e^2/h)$, where e is electronic charge=$1.6\times 10^{-19}$ coulombs, and h is Planck's constant=$6.6.\times 10^{-34}$ J-s]. Non-ideal contacts increase the nanotube resistance by almost two to three orders of magnitude, to about 1 MΩ, as is observed for bulk naontubes 301. Also, the bulk thermal conductivity of untreated nanotube networks is observed to be very low, in some cases comprising about 35 to about 200 W/m-K, and is attributed to interface scattering of phonons.

When nanotubes 301 are embedded in other thermally conducting materials, such as thermal grease, or solder, or copper, or ceramics, lattice mismatch may be significant, leading to increased phonon 303 scattering. It is known that by lowering phonon 303 scattering at the interfaces between two dissimilar materials, such as the nanotube 301 and the matrix 310, reduction of the interfacial stress, and additionally a reduction in the lattice mismatch between the materials (that is, improving atomic-scale registry at the interface) may be achieved.

Figure 3B:
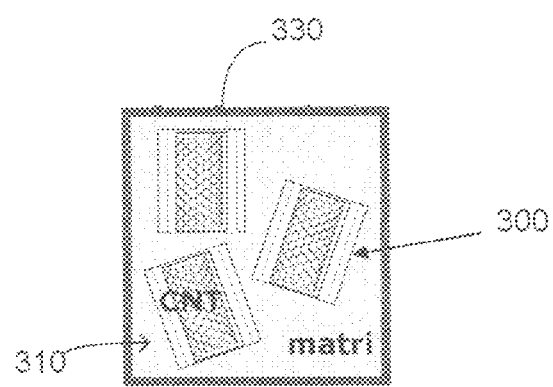
FIG. 3*b* represents a structures according to an embodiment of the present invention.

FIG. 3b depicts at least one layered nanotube structure 300 according to embodiments of the present invention. Significant reduction of the phonon scattering across nanotube 300 interfaces is achieved by using functionally graded layered materials, where the first layer in direct contact with nanotube 300 comprises a close lattice match or registry with the nanotubes, followed by layers that wet each other, and lastly forming layers that wet the matrix as well.

Metals such as nickel, titanium or tungsten show good wetting with carbon materials as well as with metal matrix materials such as copper or solder. Alternatively, the graphitic structures that may be functionalized with thiols or amines, for example, may attract various short chain polymers, which may wet a polymer matrix. In this manner, lattice mismatch between nanotubes and various matrix materials can be lowered, leading to better phonon transfer and reduction in thermal and/or electrical resistance.

At least one layered nanotube structure 300 may comprise a significantly lowered electrical and thermal resistance within the matrix. In some embodiments, a microelectronic structure 330 comprising the at least one layered nanotube structure 300 may comprise at least one of a package joint structure, and a conductive interconnect structure, for example, but the microelectronic nanotube structure 330 may comprise any type of microelectronic structure that may be used in various apparatuses, such as in microelectronic devices and package structures. In some embodiments, the microelectronic nanotube structure 330 may comprise a portion of a high current density package interconnect structure as well as a portion of a high thermal conductivity thermal interface materials (TIM) in microelectronic packages.

Figure 4:
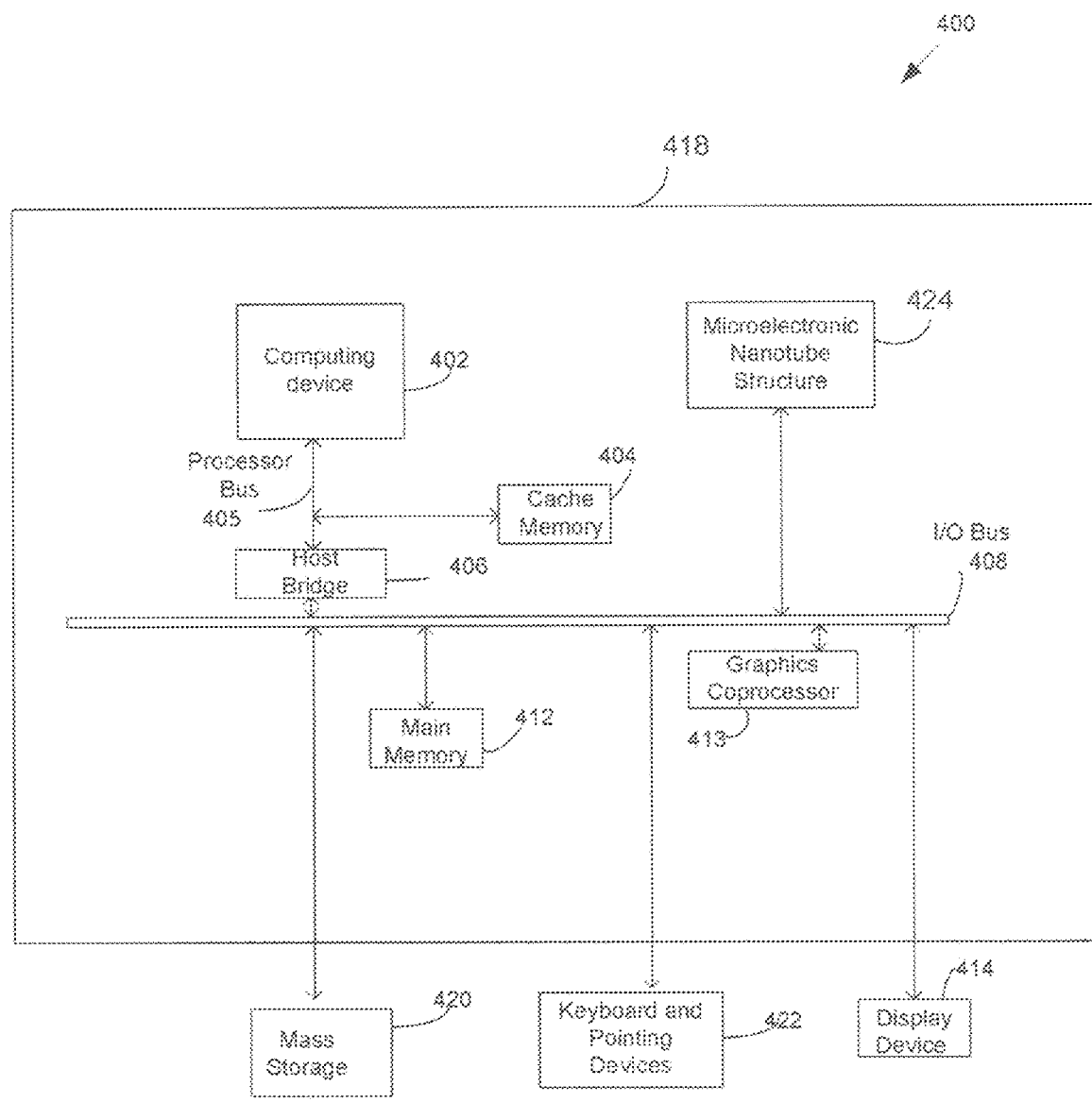
FIG. 4 represents a system according to an embodiment of the present invention.

FIG. 4 is a diagram illustrating an exemplary system 400 capable of being operated with microelectronic structures of the present invention, such as the microelectronic nanotube structure 330 comprising the layered nanotube structure 300 of FIG. 3b, for example. It will be understood that the present embodiment is but one of many possible systems in which the conductive interconnect structure of the present invention may be used.

In the system 400, the microelectronic nanotube structure 424 may be communicatively coupled to a printed circuit board (PCB) 418 by way of an I/O bus 408. The communicative coupling of the microelectronic nanotube structure 424 may be established by physical means, such as through the use of a package and/or a socket connection to mount the microelectronic nanotube structure 424 to the PCB 418 (for example by the use of a chip package, interposer and/or a land grid array socket). The microelectronic nanotube structure 424 may also be communicatively coupled to the PCB 418 through various wireless means (for example, without the use of a physical connection to the PCB), as are well known in the art.

The system 400 may include a computing device 402, such as a processor, and a cache memory 404 communicatively coupled to each other through a processor bus 405. The processor bus 405 and the I/O bus 408 may be bridged by a host bridge 406. Communicatively coupled to the I/O bus 408 and also to the microelectronic nanotube structure 424 may be a main memory 412. Examples of the main memory 412 may include, but are not limited to, static random access memory (SRAM) and/or dynamic random access memory (DRAM), and/or some other state preserving mediums. The system 400 may also include a graphics coprocessor 413, however incorporation of the graphics coprocessor 413 into the system 400 is not necessary to the operation of the system 400. Coupled to the I/O bus 408 may also, for example, be a display device 414, a mass storage device 420, and keyboard and pointing devices 422.

These elements perform their conventional functions well known in the art. In particular, mass storage 420 may be used to provide long-term storage for the executable instructions for a method for forming microelectronic nanotube structures in accordance with embodiments of the present invention, whereas main memory 412 may be used to store on a shorter term basis the executable instructions of a method for forming microelectronic nanotube structures in accordance with embodiments of the present invention during execution by computing device 402. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 412 may supply the computing device 202 (which may be a processor, for example) with the executable instructions for execution.

Thus, benefits of the present invention include but are not limited to lowering the nanotube interfacial resistance to control bulk thermal and electrical properties of nanotube networks as well as those of the nanotubes in composites. Embodiments of the invention provide nanotube architectures and nanocomposites with high electrical and thermal conductivities, such as are needed for microelectronic packaging applications, for example. The various embodiments allow for the gradual reduction of interfacial resistance across nanotube interfaces for any matrix material surrounding nanotubes, through the use of functionally graded interface layers.

The various embodiments, materials and processes of the various embodiments described herein are applicable to nanotubes of any composition, including carbon nanotubes, boron nitride nanotubes, and the like or their combinations, and the nanotubes of various diameters as well as chirality. This invention relates to nanotubes grown by any method, including CVD deposition, solution methods, and the like. This invention relates to any nanotube architectures, including aligned, criss-cross, and random nanotube arrays, as well as nanotube-based composites comprising solder, metal, and polymer matrices.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices, such as a microelectronic packages, are well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method of forming a layered nanotube structure comprising:
    forming a carbon containing layer on a nanotube;
    forming a carbide forming layer on the carbon containing layer;
    forming a matrix reacting layer on the carbide forming layer; and
    forming a matrix layer on the matrix reacting layer.

2. The method of claim 1 further comprising wherein the carbon containing layer comprises at least one of carbon black, activated carbon and amorphous carbon, and further comprising wherein the carbide forming layer comprises at least one of tungsten, nickel, titanium, and tantalum, wherein the matrix comprises a metal containing matrix.

3. The method of claim 1 the matrix comprises at least one of a neighboring nanotube, a solder, a metal and a polymer.

4. A layered nanotube structure comprising:
    a carbon containing layer on a nanotube wherein the carbon containing layer comprises at least one of carbon black, activated carbon and amorphous carbon;
    a carbide forming layer disposed on the carbon containing layer wherein the carbide forming layer comprises at least one of tungsten, nickel, titanium and tantalum;
    a matrix reacting layer disposed on the carbide forming layer; and
    a matrix layer disposed on the matrix reacting layer wherein the matrix layer comprises a metal containing matrix.

5. A layered nanotube structure comprising:
    a carbon containing layer on a nanotube;
    a carbide forming layer disposed on the carbon containing layer;
    a matrix reacting layer disposed on the carbide forming layer; and
    a matrix layer disposed on the matrix reacting layer wherein the layered nanotube structure comprises an interfacial thermal resistance below about $0.05°$ C.-cm$^2$/W.

6. The structure of claim 4 wherein the layered nanotube comprises a portion of at least one of a conductive interconnect and a package joint structure.

* * * * *